United States Patent [19]
Ors et al.

[11] Patent Number: 4,511,757
[45] Date of Patent: Apr. 16, 1985

[54] CIRCUIT BOARD FABRICATION LEADING TO INCREASED CAPACITY

[75] Inventors: Jose A. Ors, Solebury Township, Bucks County, Pa.; Richard D. Small, Jr., West Windsor Township, Mercer County, N.J.

[73] Assignee: AT&T Technologies, Inc., New York, N.Y.

[21] Appl. No.: 513,485

[22] Filed: Jul. 13, 1983

[51] Int. Cl.³ .............................................. H05K 1/03
[52] U.S. Cl. .................................. 174/68.5; 428/901; 430/11
[58] Field of Search ......................................... 174/68.5

[56] References Cited

U.S. PATENT DOCUMENTS

| | | | |
|---|---|---|---|
| 3,934,335 | 1/1976 | Nelson | 174/68.5 X |
| 4,054,479 | 10/1977 | Peiffer | 174/68.5 X |
| 4,090,936 | 5/1978 | Barton | 204/159.18 |
| 4,103,102 | 7/1978 | Klein | 174/68.5 |
| 4,115,185 | 9/1978 | Carlson et al. | 174/68.5 X |
| 4,121,007 | 10/1978 | Kobayashi et al. | 174/68.5 X |
| 4,130,424 | 12/1978 | Feit et al. | 96/35.1 |
| 4,169,732 | 10/1979 | Shipley | 96/35.1 |
| 4,171,974 | 10/1979 | Golda et al. | 96/75 |
| 4,299,893 | 11/1981 | Pigeon et al. | 430/8 |

Primary Examiner—R. R. Kucia
Attorney, Agent, or Firm—Joel F. Spivak

[57] ABSTRACT

Printed circuit boards having a plurality of circuit layers are produced on a copper-clad substrate by first forming a pattern in a desired configuration to produce the first layer of the printed circuit board, then covering it with an energy-sensitive material comprising a rubber modified epoxy resin, an acrylated epoxy resin and a viscosity modifier; the energy-sensitive material is delineated in a desired pattern and developed to uncover portions of the underlying metallization pattern and the entire substrate is then blanket cured to produce a rigid layer having openings in appropriate places; the openings are metallized and a second copper pattern is produced on the cured polymer by conventional metallization and lithographic techniques. If desired, the process is repeated until a suitable number of copper patterned levels are obtained.

6 Claims, 2 Drawing Figures

CIRCUIT BOARD FABRICATION LEADING TO INCREASED CAPACITY

TECHNICAL FIELD

This invention relates to electronic circuitry and in particular to printed circuit board technology.

BACKGROUND OF THE INVENTION

The electrical interconnection between printed circuit boards in electronic equipment contributes significantly to the price of the equipment. Thus, there has been widespread effort to increase the interconnection density of printed circuit boards and thus decrease their size and the associated system cost. In one configuration employed to increase interconnection density, printed circuit patterns are placed on both major surfaces of a substrate such as a glass reinforced epoxy substrate. Electrical interconnections between points in the two patterns are made by drilling through the substrate and metallizing the hole. This configuration significantly increases the capacity of one printed circuit board. However, the holes drilled for interconnection are large, e.g., approximately 0.015 to 0.045 inches. Since the holes are larger than the typical width of a pattern section, generally 0.005 to 0.015 inches, they extend beyond the limits of a pattern line. Adjacent pattern lines must be deflected to avoid short circuits with the enlarged metallized portion surrounding the interconnection hole. Thus, the holes occupy a significant area and therefore increase the size of the printed circuit. In addition, these holes necessitate an increased complexity in the design of the printed circuit board pattern.

Multiple level pattern configurations have also been employed to further increase the capacity of printed circuit boards. In one such configuration, printed circuit board patterns are formed on both major surfaces of two or more separate substrates (C-stages). An adhesive bonding layer, for example, an epoxy impregnated glass cloth (B-stage) is sandwiched between two or more substrates each having their associated copper patterns on both major surfaces. The multilevel configuration is completed by sandwiching the two C-stages and the intermediate B-stage between external layers which include a copper foil and an additional C-stage layer, with their associated B-stage adhesive layers. The entire structure is pressed together at an elevated temperature. The pressure and elevated temperature cures the B-stage resin and produces a monolithic structure. By appropriately configuring the copper patterns on the outer copper foil layer and by appropriately aligning the resin-encapsulated inner pattern on each substrate, electrical interconnection between the patterns on different substrates is possible by drilling holes completely through the structure and metallizing the holes. However, there are significant difficulties associated with aligning the appropriate sections of the patterns on each substrate so that a suitable electrical interconnection is made. Additionally, in this multiple level configuration, electrical contact between patterns on the same substrate are made as described previously in the two-sided printed circuit board. Thus, the problems encountered with two-sided printed circuit boards, e.g., large holes producing increased size and pattern complexity are also inherent in this multiple level board. Further, since an interconnection hole is drilled through the entire structure an interconnection between two patterns induces a hole with its associated complications in all the circuit layers.

A multiple level circuit board has been developed that does not require the physical alignment of two independent substrates. In forming this structure, a copper layer is deposited on a carrier. A photoresist is applied to the copper layer and imaged in the desired pattern so that the copper areas of the underlying layer forming the desired pattern are covered and the remainder of the copper layer is exposed. The exposed copper is removed by etching and the photoresist is then removed leaving copper in the desired circuit pattern on the carrier. A new photoresist layer is deposited and delineated so that holes in the resist are opened where connections between pattern levels are to be made. A blanket layer of copper is then evaporated onto the substrate over the resist and thus as a consequence, onto the exposed regions of the copper pattern. The photoresist is then removed together with any overlying copper to leave a pattern with interconnection studs formed by the evaporated Cu. Polyimide resin is then deposited onto the copper. The top of the polyimide is abraded to expose the copper interconnection studs. A photoresist is deposited onto the polyimide and suitably delineated to leave exposed areas of the polyimide where a second level copper pattern is to be formed. (This pattern includes the copper studs which are used as interconnection between the pattern levels.) A second copper layer is then deposited on the exposed polyimide and copper studs and the photoresist is removed leading to an interconnected two layer configuration. The steps are repeated to produce successive patterned layers. That is, photolithography is again done by conventional techniques to delineate the desired interconnection openings, copper is evaporated onto the resist, the resist is removed, a second layer of polyimide is deposited, the surface of the polyimide is abraded to expose the copper, photolithography is employed to delineate the next pattern layer and copper is deposited onto the resist. As can be seen from the accompanying description, a large number of processing steps are involved. Thus, a high-density printed circuit board that is producible in a nominal number of steps was not yet available.

More recently a process, as shown in FIG. 1, has been developed which allows the manufacture of high-density multiple level printed circuit boards in a relatively small number of steps. In one embodiment, the process is begun with a conventional substrate 31, having a desired electrical conductor, e.g., copper 32, patterned thereon. An energy sensitive material 33, i.e., a material such as a polymer precursor, which upon exposure to appropriate electromagnetic radiation undergoes a modification, e.g., a chemical change such as cross-linking which in turn modifies the mechanical and/or chemical properites of the material, is deposited on the substate 31 with its conductor pattern 32 as shown in 1B. After its deposition, the energy sensitive material is patterned as shown in 1C. In a preferred embodiment the energy sensitive material 33 is then subjected to a blanket exposure of radiation, e.g., ultraviolet light, with an intensity significantly greater than that used for the initial pattern delineation. This second exposure further completes the desired modification. A conductor 34, e.g., copper, is deposited directly onto the resulting patterned insulating material 33. The copper 34 fills the voids 35 in the energy sensitive material formed during the previous patterning steps and thus contacts the initial copper pattern 32. Additionally, the copper forms a layer on the energy sensitive material 33. Thus, in one step a copper layer 34 is presented for production of a second suitable patterned copper layer 35 and interconnection between copper layers is provided. The desired pattern is formed in the newly deposited copper layers through conventional photolithography leading to configuration 1E.

The energy sensitive, delineable material is chosen so that after patterning an electrical conductor, e.g., copper, deposited there-upon, it has sufficient adherence to produce a durable bond. By depositing an electrical conductor directly and permanently onto the surface of the irradiated photosensitive material a number of previously required processing steps are eliminated. A suitable energy sensitive material is taught to be formed by combining (1) an acrylated epoxy resin; (2) a vinyl-terminated rubber, e.g., a copolymer of acrylonitrile and butadiene, which is, in turn, terminated with acrylic acid moieties; and (3) a suitable viscosity reducer, e.g., a monomer such as isobornyl acrylate or a solvent such as ethylene glycol.

If desired, further pattern levels with the associated connection between levels are built by repeating the above-described process, i.e., by sequentially depositing an appropriate energy sensitive material, delineating the material, if desired, blanket exposing the material, depositing the copper directly upon it and then forming the desired copper pattern. The use of the described processing steps in conjunction with an energy definable material to which copper adheres after patterning and which has sufficient dielectric strength and electrical resistivity to separate adjacent copper layers yields a multiple level, high-density printed circuit board that is produced with a relatively small number of processing steps. It is possible for typical coating thicknesses to produce interconnection holes, i.e., vias, as small as 0.004 inches without drilling holes through the entire structure. Thus, the size and complexity of the circuit board is not unnecessarily increased. It is also possible to produce multilevel circuit configurations on both sides of the previously described two-sided circuit board or, for example, on circuit boards based on flexible substrates. Additionally, the energy definable material is useful after irradiation as a final protective coating for the completed circuit board.

While the above-mentioned technique is advantageous, problems have been encountered in using the aforementioned energy sensitive material. We have discovered that these problems are primarily due to a certain degree of incompatibility between the acrylated epoxy resin and the vinyl terminated rubber which leads to separation of the product into two phases resulting in non-uniformity of the resultant film and imaging and curing problems. We have now discovered an energy sensitive material which, while based upon similar ingredients as the aforementioned material, results in a more compatible combination leading to substantially more uniform film composition and morphology utilizing the process described with respect to FIG. 1. The energy sensitive material, however, has other uses as well, e.g., in the production of solder masks.

SUMMARY OF THE INVENTION

The invention resides in an improved energy sensitive material and a method of making such material which is particularly suited for use in multilayer printed circuit board applications as the photocurable dielectric used to separate adjacent circuit layers, as well as the resultant printed circuit board which has improved uniformity and morphology as compared with similar circuit boards employing the prior art energy sensitive material.

Generally, the improved material is formed by mixing (1) an acrylated epoxy resin with (2) a rubber-modified epoxy resin which has been formed by prereacting, at elevated temperatures, an epoxy resin with a carboxy terminated rubber and forming an essentially linear acrylate terminated epoxy resin having the rubber in the backbone of the resin; and (3) a monomer or a solvent. The acrylated epoxy resin is more compatible with the acrylate terminated rubber-modified epoxy than with the prior art vinyl terminated rubber or acrylate terminated rubber thereby leading to a more uniform film upon curing. Also, the structure of the final, energy cured film differs from the prior art film and its morphology can be more easily controlled and duplicated.

DETAILED DESCRIPTION

Figure 1:
FIGS. 1 and 2 illustrate the process for producing multilayer printed circuit boards using the novel energy sensitive material.

The printed circuit boards of the subject invention are typically built on a substrate having on its surface a delineated electrical conductor, e.g., copper, pattern. (For pedagogic purposes, the remainder of the disclosure will be in terms of a copper electrical conductor. However, the invention is not confined to copper but is also applicable to other electrical conductors.) The substrate material employed and the method of producing the conductor pattern upon it is not critical. For example, a substrate composed of glass-reinforced epoxy having a thickness generally in the range of 0.010 to 0.062 inches, a flexible circuit board, a ceramic, e.g., a 99 percent alumina material, or a circuit board having electrical conductor patterns on both major surfaces may be utilized. The conductor pattern on the substrate is produced by conventional techniques, such as the subtractive, semiadditive, or fully additive deposition process. The subtractive, semiadditive and fully additive processes are described in C. F. Coombs, Jr., *Printed Circuits Handbook*, Ed., McGraw Hill, 1979 which is incorporated herein by reference.

Briefly, in the substractive method a copper layer having a thickness of approximately 0.3 to 3 mils is bonded to the surface of the substrate by a hot press lamination process. A photoresist, such as Laminar ® LD dry-film photoresist, is then coated onto the copper layer. The photoresist is exposed and developed so that the areas of the copper that are to ultimately form the desired copper pattern remain covered. The portions of the copper layer that are not covered by the delineated photoresist are removed by etching, leaving the desired copper pattern After etching, the photoresist is solvated using materials such methylene chloride.

Both the additive and the semiadditive techniques require the deposition of a conductor such as copper on an insulator, e.g., a typical substrate. When electroless deposition is employed, it is generally preferred to use specific adherence promoting steps. The steps are conventional and typically include treatment with a solvent such as dimethyl formamide to swell the insulating material and treatment with an acid, e.g., chromic acid to etch the insulating material. It is also possible to achieve the desired adherence by using vacuum deposition techniques such as vacuum evaporation or sputtering.

As discussed, the semiadditive process includes the steps of initially promoting adhesion by, for example, swelling and etching the surface of the substrate as described above. A layer of a conductive material, such as copper, approximately 10 to 50 microinches thick, is then plated onto the substrate by electroless plating or vacuum deposition. (Electroless plating processes are fully described in literature references such as W. Goldie, *Metallic Coating of Plastics,* Electrochemical Publications [1968]). The deposited conductive material layer, e.g., the copper layer, is coated with a photoresist such as a Laminar ® LD dry-film photoresist (a proprietary product of Dynachem Company). The photoresist is patterned so that upon development only the areas of the copper platng which do not ultimately form the desired pattern are covered by the resist material. The thickness of the exposed copper portions is increased to a total thickness of approximately 0.0003 to 0.003 inches by conventional electroplating. Following plating, the photoresist is removed using a solvent such as methylene chloride. The entire copper surface is then exposed to an etchant such as ammonium persulfate for a period sufficient to remove the thin copper areas that were covered by the resist. (The thicker copper areas are somewhat thinned by this etching but still have a substantial thickness.) It is also possible before removing the delineated photoresist to deposit a thin layer (0.0001 to 0.0005 inches) of a tin-lead alloy. After the photoresist is removed and etching is begun, the tin entirely protects the underlying portions of the copper pattern.

The fully additive process, in a typical embodiment employing electroless plating, involves first treating the substrate to promote adhesion by a process described previously. The treated substrate is then subjected to catalytic palladium. (See *Metallic Coating of Plastics,* supra.) A photoresist is employed to cover the substrate and is then exposed to radiation so that upon development, the areas of the substrate where the copper pattern is to be deposited are uncovered. The delineated substrate is then subjected to an electroless copper plating bath for periods typically on the order of 18 hours to yield a copper pattern thickness of about 1 mil. (See *Metallic Coating of Plastics,* supra for a description of an electroless copper plating method suitable for this procedure.) The photoresist is then removed to yield the desired pattern on the substrate. Of course, alternatively one may utilize dry plating techniques such as vacuum deposition rather than the wet electroless plating processes as described.

In accordance with the present invention, irrespective of the method employed to produce the initial copper pattern, this pattern is subsequently covered with an energy sensitive material to which, after patterning and upon appropriate processing, copper adheres. (Appropriate processing may include, for example, swelling and etching before the plating of a metal such as copper, through wet or dry plating techniques, onto the energy sensitive material.) Adhesion of the cured energy sensitive material must be good, not only with respect to any subsequently applied copper layer, but to any underlying layer as well. In addition, the cured film must possess good electrical properties, e.g., high dielectric constant and resistivity, both surface and bulk. Additionally, the energy sensitive material is chosen so that upon irradiation with appropriately chosen electromagnetic radiation, the material in the irradiated region is caused to crosslink and is less susceptible to removal, e.g., solvation, than the unirradiated regions. Preferably, after the patterning, the novel material, if desired, may be heated and/or further light treated to further cure it and thus make the remaining portion more stable. Exemplary of the novel photosensitive materials are those including: (1) an acrylated epoxy resin, with (2) the reaction product of an epoxy resin and a carboxy terminated low molecular weight rubber, e.g., a butadiene-acrylonitrile based rubber, so as to form a rubber-modified epoxy resin which is terminated with at least one energy sensitive, e.g., photosensitive, moiety such as an acrylic acid moiety, and wherein the rubber is in the backbone of the epoxy resin molecule; and (3) a viscosity lowering component, e.g., a monomer or solvent. (An energy sensitive moiety is one that will undergo a reaction under the influence of suitable energy.)

As used herein, acrylate terminated epoxy and rubber modified epoxy resins include fully acrylated as well as partially acrylated resins or mixtures thereof.

A variety of rubbers as well as a variety of epoxy resins suitable for producing the desired rubber-modified epoxy are commercially available. Exemplary of suitable rubbers are carboxy terminated rubbers, e.g., carboxy terminated butadieneacrylonitrile (CTBN) rubber with or without a terminal acrylate group, e.g., B. F. Goodrich's CTBN 1300X13 or Hycar ® X-22 being preferred.

Example of preferred epoxy resins for producing the rubber-modified epoxy are the diglycidyl ether of bisphenol A (DGEBPA) and the half acrylated derivities thereof, e.g., Shells Epon ® 828 or Epocryl 306.5, respectively. Typically, the rubber-modified epoxy should have a molecular weight in the range 2,000 to 20,000, preferably 3,000 to 10,000. Materials with lower molecular weights tend to shrink excessively while materials with higher molecular weight are generally too viscous to be handled easily. However, where applications require powder coating, then higher molecular weight solid materials would be needed.

Rubber modification, for example, of the partially acrylated (hybrid) diglycidyl ether of bisphenol A (i.e., where one of the terminal epoxy groups has been reacted with acrylic acid to form a terminal acrylate group) may be carried out by reacting the partially acrylated DGEBPA with a CTBN rubber. An esterification reaction takes place between the terminal epoxy groups of the hybrid DGEBPA and the carboxy moiety of the CTBN. The primary reaction may be represented as shown below where R is

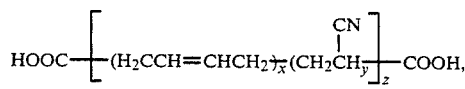

EA is

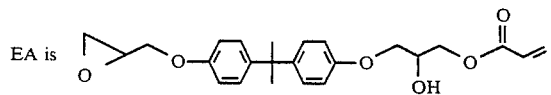

φ₃P is triphenyl phosphine catalyst

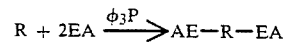

The product resulting from the esterification depends upon the relative amounts of the reactants employed. Any remaining free epoxy end groups can be acrylated, if desired, by reacting the material with acrylic acid. Further, while the AE—R—EA represents the major portion of the product, generally due to the presence of fully acrylated epoxy and non-acrylated epoxy in the commercially available partially acrylated epoxy, Epocryl 306.5, other products are formed as well. However, the type and amount of fully and non-acrylated material in the partially acrylated epoxy appears to be consistent with commercially available materials so as to make the results reproducible.

Other techniques for producing the acrylate terminated rubber-modified epoxy include:

(a) reacting a carboxy terminated rubber with an epoxy terminated resin, e.g., DGEBPA, and then acrylating the terminal groups of the resultant rubber modified epoxy by treating it with an amount of acrylic acid to produce the desired degree of acrylation; and (b) reacting a half acrylated CTBN with an epoxy or partially acrylated epoxy. Then, if desired, further acrylating the product.

EXAMPLE 1

A mixture consisting of the appropriate parts by weight of hybrid DGEBPA and CTBN was heated while stirring to 130° C. Upon reaching temperature, catalytic amounts of triphenyl phosphine were added and the mixture was allowed to react until an acid value <1.0 was obtained (approximately 4.5 hrs). Two modification reactions were carried out one using 25% by weight of CTBN and the other using 50% CTBN. Epox-A was the designation for the product obtained using 25% by weight rubber while Epox-B was the designation given the product obtained using 50% by weight rubber in the reactant mixture.

The acid value was determined by standard NaOH titration and used to monitor the progress of the reaction. The reaction was assumed complete when a constant low acid value was achieved. The reacted mixture was then transferred while warm and stored in the dark. The epoxy equivalent weight (EEW) was determined by standard titration procedure and the values compared to the starting hybrid's EEW in Table 1.

TABLE 1
EXPERIMENTAL VALUES OF THE SYNTHESIS OF EPOX

| Sample | Acid Value | EEW | Equiv/100 gms |
| --- | --- | --- | --- |
| DGEBPA | — | 465.5 | 0.215 |
| CTBN | 23.2 | — | — |
| Epox-A | 0.4 | 688 | 0.145 |
| Epox-B | 0.08 | 11363 | 0.073 |

According to the EEW value, the Epox-A and Epox B contain approximately 89% and 68% unreacted epoxy groups respectively, remaining from the starting hybrid resin.

A chromatographic trace of the synthetic material shows the molecular weight (MW) distribution to include a large percentage of modified hybrid material at approximately 25,000 MW along with a wide distribution of lower MW products. The latter leads to a possible product formula for the high molecular weight component shown below $$X - (R - EE)_n - R - Y \text{ where } n = 5.5, \text{ M.W.} = 24{,}500$$

where $X$ and $Y = AE, EE$ $AE = \text{Acr—DGEBPA}$ $EE = \text{DGEBPA}$ $R = \text{Acrylonitrile butadiene rubber}$ The terminal groups consist of any combination of AE and EE. The expected product formula as previously shown should have been AE—R—EA which yields a MW of approximately 4300 gms/mole; however, due to the composition of the starting hybrid resin being a mixture of half acrylated, fully acrylated and non-acrylated DGEBPA, the DGEBPA becomes a more reactive component leading to the higher MW distribution. The molecular weight was therefore a function of both the EE and AE concentration since the fragments would cease to grow ($n = 1,2,3,\ldots$) once the ends were capped by the EA group.

A series of formulations that include the synthetic EPOX A & B as a component has been studied. This new rubber-modified epoxy differs from Goodrich Hycar® X-22 and X-23 vinyl terminated butadiene rubbers in that (1) the end group consists of acrylated DGEBPA versus the glycidyl acrylate found in the commercial materials and (2) the CN content in the Epox-A&B is approximately 27% as compared with about 17% for the commercial rubber, leading to higher rubber/resin compatibility. The formulations used in this study are given in Table 2.

A number of formulations with 10 to 25 weight percent rubber were investigated for use as the photodefinable dielectric for multilayer printed circuit boards. The optimum modified epoxy-rubber concentration for metallization was found to be between 15 and 20 weight percent for either Epox-A or Epox-B. Generally, formulations comprised an acrylated bisphenol A based epoxy resin as the major constituent. In combination with the resin is the rubber-modified epoxy, suitable monomeric reactive diluent(s), photoinitiator, catalysts, pigment, etc. in a variety of concentrations. The particular formulation preferred varies with the particular use to which the film is to be put.

As shown in Table 2, two basic resins (SR-348 and Celrad 3700) were used in combination with the diluents and the hybrid rubber-modified epoxy component.

TABLE 2

| Formulation # | Celrad 3700 | EBPADMA SR-348 | EEA | PETA | EHA | Expo-A | Expo-B | DMPA I-651 |
| --- | --- | --- | --- | --- | --- | --- | --- | --- |
| 13A | | 37.0 | 13.0 | 5.0 | | 42.0 | | 3.0 |
| 13C | | 21.5 | 11.5 | 5.5 | | 58.6 | | 2.9 |
| 13D | | 36.0 | 8.3 | | | 52.7 | | 2.9 |
| 13E | | 25.0 | 7.0 | | | 65.5 | | 2.5 |
| 13F | | 12.7 | 9.3 | | | 74.9 | | 3.0 |
| 13G | | 6.7 | 10.7 | | | 80.5 | | 2.1 |
| 33 | 42.0 | | | | 19.0 | | 37.0 | 2.0 |

TABLE 2-continued

| Formulation # | Celrad 3700 | EBPADMA SR-348 | EEA | PETA | EHA | Expo-A | Expo-B | DMPA I-651 |
|---|---|---|---|---|---|---|---|---|
| 50 | 41.0 | | | | 19.0 | | 35.0 | 3.0 |

(a) Components listed as weight percent
(b) Formulation 50 also contains 1% by weight each of Imidazole, Modaflow and magenta pigment.
(c) Celrad 3700 is a diacrylate of DGEBPA made by Celanese Corp.
(d) SR-348 is an ethoxylated bisphenol A dimethacrylate made by Sartomer Corp.
(e) EEA is ethoxylethylacrylate
(f) PETA is pentaerythrytol triacrylate
(g) EHA is 2-ethylhexylacrylate
(h) DMPA is a 2,2-dimethoxy-2-phenyl-acetophenone made by Ciba-Geigy Corp.

Both the rubber-modified epoxy resin and the acrylated epoxy resin are generally relatively viscous. This viscosity makes handling and coating of the material on a substrate quite difficult. A variety of techniques are available for reducing the viscosity of the mixture. The basic desire is to form a water-clear mixture that is not cloudy and that has a viscosity suitable for the method chosen to apply the mixture to the desired substrate. (For typical coating procedures such as curtain coating, roller coating, or screen printing, viscosities in the range 100 to 100,000 centipoise are desirable. See *Coating and Laminating Machines* by H. L. Weiss, Coatings Technology Co. [1978] and *A Practical Guide to U. V. Curing in Screen Printing For Printed Circuits and the Graphic Arts*, Ed by S. G. Wentink and S. D. Koch, Technology Marketing Corp. [1981] for a description of such techniques.) In the first technique, the resins are cosolvated by a suitable solvent such as diethylene glycol monomethyl ether or diethylene glycol monoethyl ether acetate. If a solvent is employed, the solvent after coating is generally removed from the mixture by simply heating the mixture. However, the temperature used to remove the solvent should typically be less than 120° C. to avoid initiating a reaction in the photosensitive material.

Another means for reducing viscosity involves the use of a monomer that reacts under the influence of electromagnetic radiation with one or more of the polymers. Generally, a low viscosity (less than 200 centipoise) reactive monomer composition is added primarily to bring these materials together into one water-clear phase and to reduce the viscosity of the entire composition to a manageable level. Typically, to accomplish this purpose, the molecular weight of the monomer should be typically less than 500. Generally, if the monomer does not react with the remainder of the energy sensitive composition, the energy sensitive properties of the entire composition are degraded. For such reactivity, the monomer should have groups such as acrylate, acrylamide, or n-vinyl. The reactive groups are chosen so that they lead upon exposure, to chain lengthening, rather than cross-linking in the energy sensitive composition, i.e., they tend to extend the chain by linking the main backbone of the acrylated epoxy and/or the rubber-modified epoxy resins. If excessive cross-linking is initiated, it becomes difficult to promote adhesion to the material through swelling and etching. However, for applications such as a solder mask, higher cross-link densities are desirable. For multilayer printed wiring board applications, reactive diluents and cross-link additives were selected based on their: insulation resistance performance, chemical structure, degree of functionality, and compatibility with the resins. These diluents reduce the viscosity of the mixture, in lieu of solvents, while imparting various characteristics into the cured film, i.e., increased crosslink density. Diluents that satisfy the requirements of the composition include those listed in Table 3 or mixtures thereof.

TABLE 3

| Acrylate Functional Monomers Material[a] | Functionality[b] | Resistance (Ohms) |
|---|---|---|
| Cyanoethyl Acrylate (CEA) | Mono | $4.7 \times 10^8$ |
| Ethylhexyl Acrylate (EHA) | | $2.8 \times 10^{10}$ |
| Isobornyl Acrylate (IBOA) | | $2.9 \times 10^{11}$ |
| Phenoxyethyl Acrylate (PEA) | | $2.4 \times 10^9$ |
| Diethylene Glycol Diacrylate (DEGDA) | DI | $2.9 \times 10^{10}$ |
| Hexanediol Diacrylate (HDODA) | | $1.0 \times 10^{11}$ |
| Triethylene Glycol Diacrylate (TEGDA) | | $3.3 \times 10^9$ |
| Trimethylol Propane Triacrylate (TMPTA) | TRI | $4.5 \times 10^{11}$ |
| Trimethylol Propane Trimethacrylate (TMPTMA) | | $2.2 \times 10^{11}$ |

[a]Mixtures composed of 1 part monomer and 2 parts Purelast 195 oligomer
[b]Degree of acrylate functionality - generally the selection of a specific monomer is in part based on that higher degree of functionality will yield a higher crosslink density The energy sensitive material is prepared by physically mixing the rubber-modified epoxy with the epoxy acrylate and with a suitable viscosity control component. Typically, the mixture should contain between 10 and 30 weight percent, preferably between 10 and 20 weight percent of the rubber-modified epoxy; between 25 and 45 weight percent, preferably between 30 and 40 weight percent, of the acrylated epoxy; and the remainder monomer. (If a solvent is used instead of monomer or in addition to it, the amount of this solvent is not critical. Sufficient solvent should be used to maintain viscosity at the appropriate level required for the particular coating application technique.)

It is possible to include additives such as colorants to produce a desired color, or fillers (e.g., fumed silica) to enhance thixotropic properties, e.g., to yield a desired viscosity for applying the material to a substrate through screen printing. Additionally, a photoinitiator, such as benzoin ether, may be added, if needed to the mixture to initiate reaction in the areas exposed to actinic radiation. Conventional photoinitiators, such as a benzoin ether, e.g., diethoxyacetophenone, or benzophenone 2,2-dimethoxyphenylacetophenone (DMPA) are used to initiate the reaction in the acrylate photosensitive material and are generally added to the photosensitive material in a concentration of 1 to 5 weight percent. DMPA was used in the formulations described above.

The monomer has an effect on the ultimate properties of the polymer. Although viscosity is the most significant of these properties, other properties are also affected. For example, to a lesser extent the electrical properties, i.e., the resistance, and the glass transition temperature are affected. A resistance greater than $2 \times 10^8$ ohm for surface resistance and $4 \times 10^8$ ohm/cm for volume resistivity when tested by the ASTM D257 test, for the processed energy sensitive material is typically desirable to electrically isolate the various copper pattern levels.

A combination of suitable monomers are useful for producing properties not available by using a single monomer. For example, IBOA yields excellent resistivity but also leads to a higher viscosity than other monomers. Thus, for example, it is desirable to use a combination of IBOA with NVP to yield both quite desirable resistivity and viscosity.

When the ambient temperature is above Tg adhesion of the photosensitive material to the underlying substrate is generally degraded. Thus, for stability of the final product, the glass transition temperature should be above 50° C., preferably above 85° C. Although the epoxy chosen has the greatest effect on this property, generally monomers consistent with the desired Tg for the photosensitive mixture should be employed.

Figure 2:
Figure 2:
Figure 2:
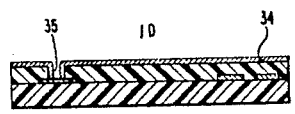
Figure 2:
Figure 2:
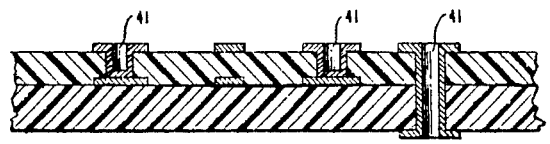

After the initial copper pattern is produced on the substrate, the energy sensitive material is coated onto it. Polymer thicknesses in the range 2 to 10 mils are typically employed. Thinner energy sensitive material layers lead to inadequate coverage and resistance, while thicker energy sensitive material layers typically produce inadequate resolution on fine line or via patterns. The material is exposed by conventional techniques using actinic radiation in the desired pattern at a relatively low intensity level, e.g., 5 to 20 mW/cm$^2$ for periods in the range 15 seconds to 2 minutes. In the preferred embodiment, the exposure is done so that the regions in the energy sensitive material to be removed leaving an opening or via is not exposed. For example, the use of radiation in the wavelength range 250 to 350 nm for acrylate materials and their initiators yield upon development a configuration where the openings in the energy sensitive material leave uncovered areas in the underlying pattern to which interconnection between pattern layers are to be made. That is, as shown in FIG. 2, the interconnection, 41, is made through such openings. (For simplicity the initial substrate with its copper pattern is not shown in FIG. 2.) Since the attainable hole size is typically 1 to 2 times the thickness of the energy sensitive material layer, extremely small holes, as compared to conventional printed circuit board technology, are attainable. There is no necessity for drilling holes to produce this interconnection and additionally, interconnection between several layers need not be made in a straight vertical configuration. (Configurations such as shown in FIG. 2 are possible.)

To develop the energy sensitive material, through removal processes such as solvation, development solvents such as 1,1,1-trichloroethane, ethylene glycol, or diethylene glycol monobutyl ether are employed. After the photosensitive material has been exposed and developed, it is generally desirable to further promote the change, e.g., chemical reaction, begun by the initial exposure to yield an even more stable exposed material by a relatively high-dose, blanket exposure to energy, e.g., employing ultraviolet light (250 to 350 nm), with a typical dose in the range 40 to 80mW/cm$^2$ for a period of 30 seconds to 1 minute. Initial exposure with high doses of energy before development without a subsequent further blanket exposure although not precluded is typically undersirable since higher doses prevent the production of openings of approximately the same diameter as the thickness of the photosensitive material. However, if suitable openings are attainable for a single exposure before development, then the use of subsequent blanket exposure is not essential provided the material is sufficiently electrically resistant without a second exposure.

Upon patterning and if desired blanket exposing the energy sensitive material, the surface and the openings, i.e., via holes, in the material are metallized by conventional techniques, e.g., swell and etch followed by electroless plating, vapor deposition or sputtering. A desired pattern is then produced on top of the cured resin in the copper layer by techniques such as the previously described fully additive and semiadditive deposition procedure. The process of energy sensitive material deposition, photodelineation and copper pattern production upon the deposited material is repeated until the desired number of layers are obtained.

DMPA was the photoinitiator used in all the formulations described above but other photoinitiators are suitable. The nature of the hybrid materials leads to "free" (uncured) epoxies with completion of the photocure. The use of thermal catalysts to cure these free epoxies was included in the #—50 formulation. Allowing for the further cure of the film in the thermal step improves the initial electrical properties and increases the Tg of the cured film.

The standard full cure (blanket cure) of these mixtures was carried out in a Colight-UVC24. The curing procedure was normally conducted by passing the sample film under a 200 V medium pressure Hg vapor lamp. The effective lamp flux was measured using an International Light 440 photoresist radiometer ($\lambda$max—400nm) and recorded as 75 mW/cm$^2$. The total exposure time was 16.5 secs. After exposure the samples were metallized for evaluation (Table 4).

TABLE 4

| | COPPER ADHESION EVALUATION STUDY | |
|---|---|---|
| Function[a,b] | Electroless[c] Peels lbs/in | Electroplated[c] Peels lbs/in |
| 13G | 6.0 | |
| | 6.5 | |
| | 6.5 | |
| 50 | 7.9 | 11.3 |
| | 9.3 | 10.0 |
| | 10.1 | 9.9 |

The preferred method of preparing the prereacted rubber-modified epoxy component of the formulation is to react the non-acrylated epoxy, e.g., DGEBPA, with the carboxyterminated rubber, e.g., CTBN, until a consistently low acid value, e.g., 0.01–1.5 is obtained and finally to react the resultant rubber-modified epoxy having terminal epoxy groups with a vinyl acid, e.g., acrylic acid, so as to cap the end groups to the desired extent with the acrylate or other vinyl radical by esterification of the epoxy. Any excess acid can be back titrated after the reaction is complete with a reactive epoxy monomer. Monitoring the acid value of the CTBN-DGEBPA reaction mixture is important for the purpose of achieving the desired product reproducibly.

The following table (Table 5) indicates various formulation for use as photodefinable dielectrics in the manufacture of multilayer printed circuit boards or for use as a solder mask. It should be noted that all of the formulations, upon curing, exhibit an electrical resistance of $>10^{10}$ ohms at 35° C./90% relative humidity over a 48 hour test period. The compositional variations result in variation in imaging, viscosity, Tg and metallization properties.

TABLE 5
PROPERTIES OF FILM

| Formula # | 3700 | 522 | 803 | 043 | 840 | 841 | EHA | IBOA | NVP | TACN | DMPA | Pigment | Modaflow |
|---|---|---|---|---|---|---|---|---|---|---|---|---|---|
| 91-03 | 40 | | | | 30 | | 27 | | | | 2 | 1 | 1 |
| 91-04 | 40 | | | | 20 | | 37 | | | | 2 | 1 | 1 |
| 91-07 | 25 | 10 | | | 40 | | 22 | | | | 2 | 1 | 1 |
| 91-09 | 30 | 10 | | | 20 | | 37 | | | | 2 | 1 | 1 |
| 91-10 | 40 | 10 | | | 20 | | 27 | | | | 1 | 3 | 1 |
| 91-12 | 10 | 20 | | | 30 | | 30 | 10 | | | 1 | 3 | 1 |
| 91-13 | 20 | 20 | | | 30 | | 20 | 20 | | | 1 | 3 | 1 |
| 91-14 | 20 | 20 | | | 20 | | 30 | 10 | | | 1 | 3 | 1 |
| 91-15 | 20 | 20 | | | 20 | | 20 | 20 | | | 1 | 3 | 1 |
| 91-16 | 20 | 20 | | | 20 | | 40 | 10 | | | 1 | 3 | 1 |
| 91-17 | 20 | 20 | | | 20 | | 30 | 20 | | | 1 | 3 | 1 |
| 50-07 | 10 | | 10 | 40 | | | 37 | | | | 2 | 1 | |
| 50-08 | 10 | | 10 | 40 | | | 37 | | | | 2 | 1 | |
| 50-11 | 21 | | | 43 | | | 27 | | | 10 | 2 | 1 | |
| 50.12 | 20 | | | 40 | | | | 27 | | 10 | 2 | 1 | |
| 50.13 | 20 | | | 40 | | | 37 | | | | 2 | 1 | |
| 50.14 | 20 | | | 40 | | | 27 | | | | 2 | 1 | |
| 50.15 | 30 | | | 40 | | | 17 | | | | 2 | 1 | |
| 50.16 | 40 | | | 40 | | | 17 | | | 20 | 2 | 1 | |
| 93.16 | 20 | 20 | | 20 | | | | 40 | 10 | 10 | 2 | 1 | 1 |
| 92.06 | 40 | | | | | 20 | | 37 | | | 2 | 1 | 1 |
| 91-03 | 40 | | | | 30 | | 27 | | | | 2 | 1 | 1 |
| 92.07 | 30 | 10 | | | | 20 | | 37 | | | 2 | 1 | 1 |
| 92.08 | 40 | | | | | 20 | 37 | | | | 2 | 1 | 1 |
| 92.09 | 50 | | | | | 20 | 27 | | | | 2 | 1 | 1 |
| 92.14 | 20 | 20 | | | | 20 | | 30 | 10 | | 2 | 1 | 1 |
| 92.15 | 20 | 20 | | | | 20 | | 20 | 20 | | 2 | 1 | 1 |
| 92.16 | 20 | 20 | | | | 20 | | 40 | 10 | | 2 | 1 | 1 |
| 92.17 | 20 | 20 | | | | 20 | | 30 | 20 | | 2 | 1 | 1 |
| 81.16 | | 20 | | | | 40 | | 40 | 10 | | 2 | 1 | 1 |
| 93.01 | 40 | 20 | | | | | | 40 | 10 | | 2 | 1 | 1 |

| Formula # | (°C.) Tg | Solvent Uptake | OI | Peel Strength (Wet) | Peel Strength (dry) Pd/Cu | Cr/Cu | Ni—V/Cu |
|---|---|---|---|---|---|---|---|
| 91-03 | | | | | | | |
| 91-04 | | | | 2.9/4.4 | | | |
| 91-07 | | | | | | | |
| 91-09 | | | | | | 5.3 | |
| 91-10 | 96 | | | | 4.5 | | 3.5 |
| 91-12 | | | | 3.7/4.8 | | | 4.9 |
| 91-13 | | | | | | | |
| 91-14 | | | | 2.6/3.1 | | | 5.6 |
| 91-15 | | | | | | | |
| 91-16 | 124 | 1.1 | 0.206 | 2.6/3.5 | | 5.4 | 5.6 |
| 91-17 | 111 | | | | 10 | | 5.0 |
| 50-07 | | | | | | | |
| 50-08 | | | | | | | |
| 50-11 | | | | | | | |
| 50.12 | | | | | | | |
| 50.13 | | | | | | | |
| 50.14 | | | | | | | |
| 50.15 | | | | | | | |
| 50.16 | | | | | | | |
| 93.16 | 117 | 1.2 | 0.227 | | | | |
| 92.06 | | | | | | | |
| 91-03 | | | | | | | |
| 92.07 | | | | | | | 5.8 |
| 92.08 | | | | | | | 8.2 |
| 92.09 | | | | | | | |
| 92.14 | | | | 2.1/4.2 | | | 5.1 |
| 92.15 | | | | | | | |
| 92.16 | 124 | 1.0 | 0.203 | 2.4/4.9 | | | 3.8 |
| 92.17 | | | | | | 4.0 | 5.9 |
| 81.16 | 90 | 2.5 | 0.206 | 3.5/4.3 | | | |
| 93.01 | | 0.65 | 0.216 | | | | |

The following is a key to the shorthand expressions used in Table 5.

(1) 3700 & 522 are diacrylates of diglycidyl ether bisphenol A epoxy resins of different molecular weights;
(2) 803 is a monoacrylate of a diglycidyl ether bisphenol A epoxy resin of different molecular weights;
(3) 043, 840 and 841 are prereacted fully acrylated rubber-modified epoxies resulting from the reaction of DGEBPA and a CTBN as set out more particularly in Table 5A below.

TABLE 5A

| Number | DESCRIPTION | VISCOSITY ($10^{-3}$ Cps) | ACID VALUE |
|---|---|---|---|
| 043 | Acrylated diglycidyl bisphenol-A-epoxy (BPA) derivative of | 52 | 4.9 |

TABLE 5A-continued

| Number | DESCRIPTION | VISCOSITY ($10^{-3}$ Cps) | ACID VALUE |
|---|---|---|---|
| | CTBN X13 - High acid value | | |
| 840 | Acrylated diglycidyl BPA epoxy derivative of CTBN X8-Low acid value | — | 0.5 |
| 841 | Acrylated diglycidyl BPA epoxy derivative of CTBN X15-Low acid value | — | 0.5 |

(a) Viscosity measured at 105° F.
(b) Measured by standard NaOH titration (4) NVP is N-vinylpyrrolidone
(5) TACN is triallylcyanurate
(6) The pigment was a magenta pigment from Penn Color designated as 9R75 and Modaflow is a commercially available polyester resin flow modifier manufactured by Monsanto Corporation.

The formulations designated by the 91 series of numbers also contained 0.5 parts of a perfluorinated wetting agent. As can be seen from Table 5 relatively high glass transition temperatures (Tg>85° C.) which is needed to maintain thermal stability and good polymer-copper adhesion at the elevated operational temperatures of many printed circuit boards are achieved with the novel formulations. The formulations were tested after hard curing a film of the formulation with UV light. Solvent uptake, measured in mg/cm² was determined after dipping the cured films in dimethylformamide at 35° C. for 5 minutes. The oxygen index (OI) was estimated from char yields obtained via thermogravimetric analysis in $N_2$ atmosphere at 800° C.

The "wet chemical" metallization of the films involved standard electroless plating techniques while the dry metallization involved vacuum sputtering of a very thin base film of Pd, Cr or Ni-V followed by sputtering of a thicker copper layer. Peel strengths are given in pounds per inch. In the case of the wet chemical deposited films, adhesion is given for both a pre-bake and post bake (130° C. 4 hours).

Not only do the formulations meet electrical requirements but as can be seen, meet adhesion and imaging requirements as well.

With the development of the novel formulations one can formulate material systems with added advantages. These advantages are as follows:

(i) Rubber pre-reaction: The hybrids allow us to preact the rubber into the resin backbone before curing. This technique can reduce the rubber compatibility concerns. The pre-reaction has been carried out with the commercial carboxy terminated acrylonitrile-butadiene rubbers, and can be extended to all carboxy terminated rubbers.

(ii) Mixed cure: With epoxy and acrylate terminal groups we have the capability of photodefining the PDD and then setting via a thermal epoxy curing agent and/or the use of photocationic initiators. This can lead to cured materials with higher Tg.

(iii) Substrate adhesion: The incorporation of rubber into the resin backbone results in a much higher MW backbone. This, in turn, results in less shrinkage due to less stress during cure. The minimization of shrinkage helps maintain good adhesion to substrates and image replication.

(iv) Free epoxy: The hybrid formulations with the unreacted epoxy groups should give these formulations added adhesion to substrate surfaces. Presence of these reactive groups also allow the incorporation of silane coupling agents as part of the backbone and/or complexing sites for silane primers on surfaces. This will further enhance the adhesion of PPD to substrate and PDD to PDD in a multilayer arrangement.

What is claimed is:

1. A product comprising a first and second pattern of conductive material, an electrically insulating material interposed between said first and second pattern and an electrical connection between said first and second pattern through said insulating material by a conductive via wherein said conductive via and said insulating material is formed by subjecting an energy-sensitive material to electromagnetic radiation processing to form said via and to produce said insulating material wherein said energy-sensitive material comprises a mixture of an acrylated rubber modified epoxy polymer wherein the rubber is in the backbone of the epoxy polymer and is derived from reacting an epoxy resin with a carboxy terminated butadiene-acrylonitril based rubber, an acrylated epoxy having a glass transition temperature of at least 50° C. that is compatible with said acrylated rubber modified epoxy and a viscosity modifier.

2. The product of claim 1 wherein said viscosity modifier comprises a solvent.

3. The product of claim 1 wherein said viscosity modifier comprises a monomer.

4. The product of claim 3 wherein said monomer comprises a member of the group consisting of isobornyl acrylate, hydroxyethyl acrylate, dicyclopentenyl oxyethyl acrylate, ethylhexyl acrylate and N-vinyl pyrollidone.

5. The product of claim 1 wherein said epoxy is formed from bisphenol-A.

6. The product of claim 1 wherein the rubber modified epoxy is formed from reacting a diglycidyl ether of bisphenol-A with a carboxy terminated butadient/acrylonitrile rubber.

* * * * *